United States Patent
Lo

(10) Patent No.: US 10,580,756 B2
(45) Date of Patent: Mar. 3, 2020

(54) CONNECTION PADS FOR LOW CROSS-TALK VERTICAL WIREBONDS

(71) Applicant: INTEL CORPORATION, Santa Clara, CA (US)

(72) Inventor: Hungying L. Lo, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/773,027

(22) PCT Filed: Dec. 9, 2015

(86) PCT No.: PCT/US2015/064761
§ 371 (c)(1),
(2) Date: May 2, 2018

(87) PCT Pub. No.: WO2017/099759
PCT Pub. Date: Jun. 15, 2017

(65) Prior Publication Data
US 2018/0323173 A1    Nov. 8, 2018

(51) Int. Cl.
*H01L 25/065* (2006.01)
*H01L 23/00* (2006.01)
(Continued)

(52) U.S. Cl.
CPC .......... *H01L 25/0657* (2013.01); *H01L 21/56* (2013.01); *H01L 23/48* (2013.01); *H01L 24/06* (2013.01); *H01L 24/09* (2013.01); *H01L 24/20* (2013.01); *H01L 24/32* (2013.01); *H01L 24/43* (2013.01); *H01L 24/48* (2013.01); *H01L 24/73* (2013.01); *H01L 25/50* (2013.01); *H01L 23/295* (2013.01); *H01L 23/3121* (2013.01); *H01L 23/5389* (2013.01); *H01L 24/19* (2013.01); *H01L 24/29* (2013.01); *H01L 24/45* (2013.01);
(Continued)

(58) Field of Classification Search
CPC ..... H01L 25/0657; H01L 21/56; H01L 23/48; H01L 24/06; H01L 24/09; H01L 24/20; H01L 24/31; H01L 24/43; H01L 24/48
See application file for complete search history.

(56) References Cited

U.S. PATENT DOCUMENTS 8,778,738 B1 * 7/2014 Lin .................... H01L 23/49838
438/118

* cited by examiner

*Primary Examiner* — Elias Ullah
(74) *Attorney, Agent, or Firm* — Eversheds Sutherland (US) LLP

(57) ABSTRACT

Wirebond bondpads on semiconductor packages that result in reduced cross-talk and/or interference between vertical wires are disclosed. The vertical wirebonds may be disposed in the semiconductor package with stacked dies, where the wires are substantially normal to the bondpads to which the vertical wirebonds are attached on the dies. The wirebond bondpads may include signal pads that carry input/output (I/O) to/from the die package, as well as ground bondpads. The bondpads may have widths that are greater than the space between adjacent bondpads. Bondpads may be fabricated to be larger than the size requirements for reliable wirebond formation on the bondpads. For a fixed pitch bondpad configuration, the size of the signal bondpads adjacent to the ground bondpads may be greater than half of the pitch. By increasing the size of the signal bondpads adjacent to a ground line relative to the space therebetween, improved cross-talk performance may be achieved.

19 Claims, 6 Drawing Sheets

(51) Int. Cl.
  H01L 23/48 (2006.01)
  H01L 21/56 (2006.01)
  H01L 25/00 (2006.01)
  *H01L 23/29* (2006.01)
  *H01L 23/538* (2006.01)
  *H01L 23/31* (2006.01)

(52) U.S. Cl.
  CPC ............ *H01L 2224/04042* (2013.01); *H01L 2224/04105* (2013.01); *H01L 2224/0603* (2013.01); *H01L 2224/06051* (2013.01); *H01L 2224/06132* (2013.01); *H01L 2224/0903* (2013.01); *H01L 2224/09051* (2013.01); *H01L 2224/09132* (2013.01); *H01L 2224/12105* (2013.01); *H01L 2224/19* (2013.01); *H01L 2224/214* (2013.01); *H01L 2224/2919* (2013.01); *H01L 2224/32145* (2013.01); *H01L 2224/43001* (2013.01); *H01L 2224/4321* (2013.01); *H01L 2224/45144* (2013.01); *H01L 2224/45147* (2013.01); *H01L 2224/4805* (2013.01); *H01L 2224/48106* (2013.01); *H01L 2224/73215* (2013.01); *H01L 2224/73217* (2013.01); *H01L 2224/73265* (2013.01); *H01L 2224/73267* (2013.01); *H01L 2225/0651* (2013.01); *H01L 2225/06527* (2013.01); *H01L 2225/06562* (2013.01); *H01L 2225/06565* (2013.01); *H01L 2225/06582* (2013.01); *H01L 2225/1035* (2013.01); *H01L 2225/1058* (2013.01); *H01L 2924/14* (2013.01); *H01L 2924/1431* (2013.01); *H01L 2924/1432* (2013.01); *H01L 2924/1433* (2013.01); *H01L 2924/1434* (2013.01); *H01L 2924/1461* (2013.01); *H01L 2924/19104* (2013.01)

CONNECTION PADS FOR LOW CROSS-TALK VERTICAL WIREBONDS

CROSS-REFERENCE TO RELATED APPLICATION(S)

This application is a U.S. National Stage Application under 35 U.S.C. 371 and claims the priority benefit of International Application No. PCT/US15/64761, filed Dec. 9, 2015, which is incorporated herein by reference as if set forth in full.

TECHNICAL FIELD

This disclosure generally relates to connection pads, and more particularly to connection pads for low cross-talk vertical wirebonds.

BACKGROUND

Integrated circuit(s) and other electronic components may be packaged on a semiconductor package. Input/output (I/O) connections and connections thereof may interfere (e.g., cause cross-talk) with each other. This cross-talk may result in poor I/O signaling performance and/or reduced allowable density of I/Os that may be disposed in a semiconductor package, particularly packages having multiple dies.

BRIEF DESCRIPTION OF THE FIGURES

Reference will now be made to the accompanying drawings, which are not necessarily drawn to scale, and wherein.

DETAILED DESCRIPTION OF EMBODIMENTS OF THE DISCLOSURE

Figure 1:
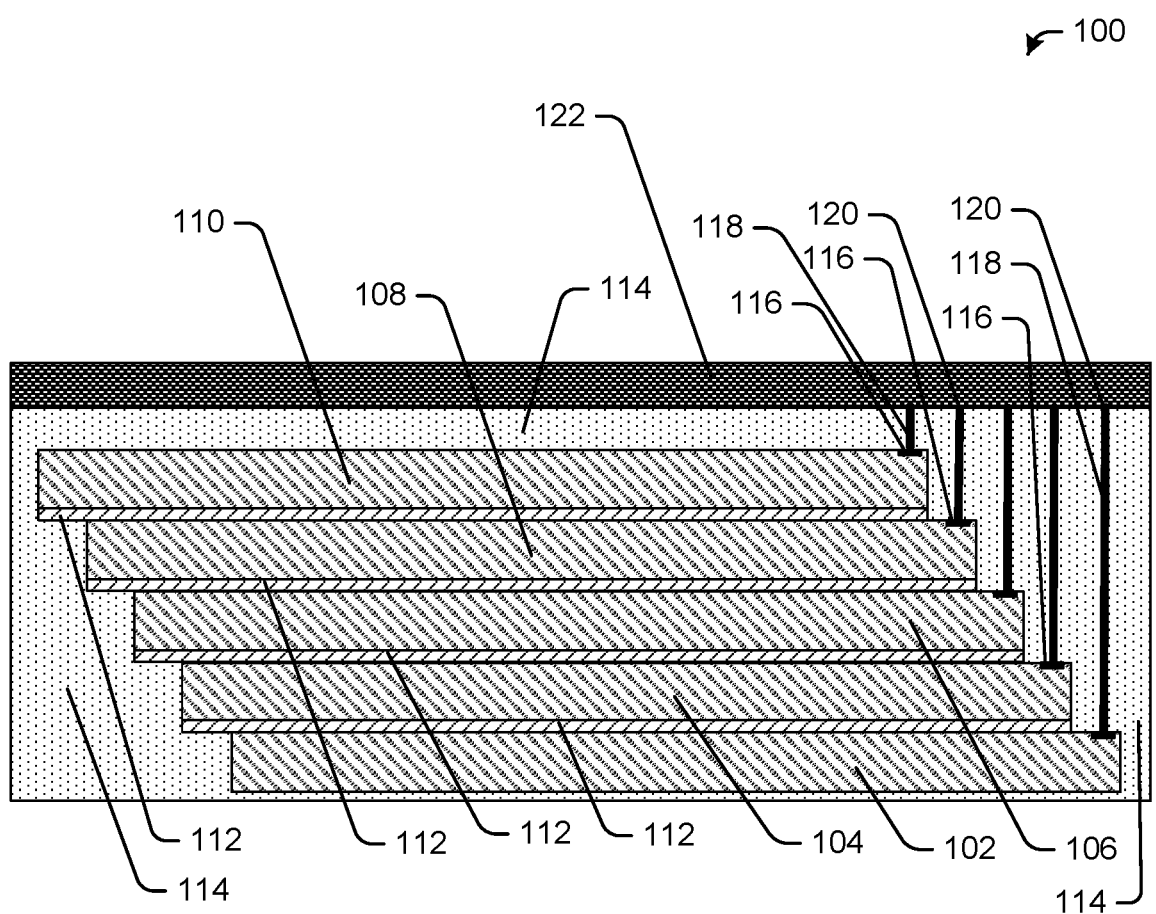
FIG. 1 depicts a simplified cross-sectional schematic diagram of a stacked die package with vertical wirebonds, in accordance with example embodiments of the disclosure.

Embodiments of the disclosure are described more fully hereinafter with reference to the accompanying drawings, in which example embodiments of the disclosure are shown. This disclosure may, however, be embodied in many different forms and should not be construed as limited to the example embodiments set forth herein; rather, these embodiments are provided so that this disclosure will be thorough and complete, and will fully convey the scope of the disclosure to those skilled in the art. Like numbers refer to like, but not necessarily the same or identical, elements throughout.

The following embodiments are described in sufficient detail to enable at least those skilled in the art to understand and use the disclosure. It is to be understood that other embodiments would be evident based on the present disclosure and that process, mechanical, materials, dimensional, process equipment, and parametric changes may be made without departing from the scope of the present disclosure.

In the following description, numerous specific details are given to provide a thorough understanding of various embodiments of the disclosure. However, it will be apparent that the disclosure may be practiced without these specific details. In order to avoid obscuring the present disclosure, some well-known system configurations and process steps may not be disclosed in full detail. Likewise, the drawings showing embodiments of the disclosure are semi-diagrammatic and not to scale and, particularly, some of the dimensions are for the clarity of presentation and may be exaggerated in the drawings. In addition, where multiple embodiments are disclosed and described as having some features in common, for clarity and ease of illustration, description, and comprehension thereof, similar and like features will ordinarily be described with like reference numerals even if the features are not identical.

The term "horizontal" as used herein may be defined as a direction parallel to a plane or surface (e.g., surface of a substrate), regardless of its orientation. The term "vertical" as used herein may refer to a direction orthogonal to the horizontal direction as just described. Terms, such as "on," "above," "below," "bottom," "top," "side" (as in "sidewall"), "higher," "lower," "upper," "over," and "under," may be referenced with respect to the horizontal plane. The term "processing" as used herein includes deposition of material or photoresist, patterning, exposure, development, etching, cleaning, ablating, polishing, and/or the removal of the material or photoresist as required in forming a described structure.

Embodiments of the disclosure may provide a semiconductor package and a method for fabrication of stacked die packages having a stack of dies with input/output (I/O) connection pads (e.g., bondpads) connected to vertical wirebonds, where the bondpads have a geometry that results in relatively reduced cross-talk between proximal vertical wirebonds. The stacked die package may have any suitable number of dies stacked therein. The dies may be stacked in a manner by which the I/O contact pads of the dies are not occluded by other dies and/or components in the stacked die package. The dies may be stacked with adhesive disposed therebetween to hold the dies together. After stacking the dies, temporary wirebonds may be formed between the I/O pads of the dies of the stacked die package and/or with a dummy die that may be placed within the package. The temporary wirebonds may be provided in a manner such that the wirebond is relatively vertical for a predetermined distance above each of the bondpads of the stacked dies. After the temporary wirebonds have been formed, the stack of dies may be encapsulated in molding, and the molding may be ground down in a top-down fashion to expose tips of wirebonds protruding substantially vertically in the molding. In some cases, if a dummy die was used to form one or more of the temporary wirebonds, the dummy die may be ground/polished away while grinding/polishing the molding. After the grinding process, stacked dies, encapsulated in molding, and having vertical wirebonds protruding in an orthonormal (normal to, or perpendicular to the wirebond bond pad) direction from the wirebond pads on the surface of the dies and terminating at the top surface of the molding may result. In example embodiments, the wires of the vertical wirebonds may be any suitable metal, including, for example, gold (Au), copper (Cu), aluminum (Al), or the like.

After the stacked and encapsulated dies with vertical wirebonds are formed, a redistribution layer (RDL) may be formed on the top surface of the molding. The RDL may have connections to the tips of the vertical wirebonds and may redistribute the I/Os of the stacked and packaged dies, such as in an area array fashion. Package-to-board connections, such as ball grid array (BGA), may be provided on the surface of the molding. Thus the stacked die package may be formed in this fashion, with substantially vertical wirebonds (e.g., pointing straight upward and normal to the surface of the corresponding respective dies).

With vertical wirebonds attached to the I/O bondpads of the stacked dies to route signals to the RDL layer, it will be appreciated that a relatively dense I/O may be achieved. Furthermore, in example embodiments, the vertical wirebonds may be relatively more robust to manufacturing issues, such as bondwire sweep defects. It will be appreciated that with vertical wirebonds, due to relatively more direct (e.g., spatially efficient) I/O pathway, the stacked die package may be configured to accommodate a relatively greater number of stacked dies. It will further be appreciated that when a relatively greater number of dies are packaged in the same package (e.g., system in a package (SiP)), a greater density of utility (e.g., memory capacity, processing power, etc.) may be realized.

The vertical wirebonds also have a configuration such that the current flow ($\vec{I}$) is substantially in the same direction along the length of the wire as the Poynting vector ($\vec{S}$), where the Poynting vector is the cross product of the electric field ($\vec{E}$) and the magnetic field ($\vec{H}$) as ($\vec{S}=\vec{E}\times\vec{H}$). It will be appreciated that this is because, as current ($\hat{I}$) flows vertically along the length of the wirebond, a magnetic field ($\vec{H}$) is generated and pointing in a clockwise direction (looking downward on the wirebond with current flowing toward the observer) around the wire, and the electric field ($\vec{E}$) emanates radially outward from the wire. Since the wire is substantially vertical and has minimal bending therein, the Poynting vector, representing power flow, is relatively more aligned with current flow than standard non-vertical wirebonds. However, due to other nearby vertical wires and/or bondpads, such as ground pads, in relative proximity of the wire, $\vec{E}$ may not be exactly orthonormal and/or perpendicular to $\vec{I}$. As a result, some of the power transfer of the wire may not be to the RDL, but to other vertical wires and/or ground wires. Thus, there may be cross-talk between the wires in the stacked die package. The connection bondpads and the method of fabricating the same, as disclosed herein, may reduce the level of cross-talk between the vertical wires of the stacked die package with vertical wirebonds.

According to embodiments of the disclosure, the level of cross-talk between the vertical wires may be reduced by increasing the size of the signal bondpads relative to the proximal ground bondpads. In some example embodiments, where a signal ground wirebond pair or ground-signal-signal-ground wirebond quartet is concerned, the signal pad(s) may be sized relatively larger than needed for forming the mechanical wirebond connections thereto. Thus the space between the signal bondpads and the ground bondpads may be relatively reduced in these example embodiments. In example embodiments, the width of the signal ground pads may be greater than half of the pitch between the signal ground pad and an adjacent ground bondpad. In other example embodiments, the width of a signal bondpad may be greater than 70% of the pitch between the adjacent bondpads. According to example embodiments, the width of the signal bondpads may have a size and shape such that the periphery of the signal bondpads may be relatively more proximal to an adjacent ground bondpad compared to a bondpad that is sized based on only mechanical bonding considerations. In some example embodiments, the width of a signal bondpad may be approximately double the width of a space between the signal bondpad and an adjacent ground bondpad. In some other example embodiments, the width of a signal bondpad may be approximately double the width of an adjacent ground bondpad. In yet other example embodiments, the width of the signal bondpad may be approximately double the minimum width of the signal bondpad for making a reliable mechanical wirebond thereto.

FIG. 1 depicts a simplified cross-sectional schematic diagram of a stacked die package 100 with vertical wirebonds 118, in accordance with example embodiments of the disclosure. As depicted, the stacked die package 100 may have a plurality of dies 102, 104, 106, 108, 110 stacked on top of one another, and there may be adhesive 112 disposed between each of the dies of the stacked die package 100 to hold the dies 102, 104, 106, 108, 110 together during the fabrication process. The stack of dies 102, 104, 106, 108, 110, as held together by the adhesive 112, may further be encapsulated by molding 114. Each of the dies 102, 104, 106, 108, 110 may have bondpads 116 disposed thereon. These bondpads 116 may be I/Os for signaling, power, ground, and/or clock, for the dies 102, 104, 106, 108, 110, or the chip on which the bondpad is provided. The bondpads 116, as connection pads, may be a point of connection of the vertical wirebonds/wires 118. In other words, vertical wires 118 may be wirebonded to the bondpads 116 and may extend substantially straight up, in a direction normal (e.g., vertically) to the bondpads 116. Each of the vertical wires 118 may terminate at a wire termination 120. The wire termination 120 of each of the vertical wires 118 may be connected to a redistribution layer (RDL) 122. The RDL 122 may have one or more layers of interconnects and may provide a conduit for package-to-board level I/Os, signal fanout, and/or dies 102, 104, 106, 108, 110 to die 102, 104, 106, 108, 110 connections within the stacked die package 100.

The dies 102, 104, 106, 108, 110 as packaged in the stacked die package 100 may be any suitable type of die and may provide a system in a package (SiP), in example embodiments. In some cases, the dies 102, 104, 106, 108, 110 may be the same type of dies, such as memory dies (e.g., DRAM, SRAM, SDRAM, etc.) to form a stacked memory package. Other examples of homogeneous dies 102, 104, 106, 108, 110 in the stacked die package 100 may include stacked processors, stacked signal processors, or any other suitable homogeneous stacked die implementation. In other cases, the dies 102, 104, 106, 108, 110 may be of different types. For example, a particular stacked die package 100 may include a memory, a communications processor, a baseband processor, a power amplifier, a low noise amplifier, and/or other components of a communications device, such as a cellular telephone or a WiFi access point. As another non-limiting example, there may be a stacked die package 100 with one or more microprocessor dies and one or more static random access memory (SRAM) dies where the one or more SRAM dies serve as level one (L1) or level two (L2) cache memory for the one or more microprocessor dies.

The adhesive 112 may be any suitable type of adhesive. In example embodiments, the adhesive 112 may be an epoxy that may adhere to the dies 102, 104, 106, 108, 110. In example embodiments, the epoxy may be any suitable curable epoxy. In some example embodiments, the epoxy may be a stage B epoxy.

The wirebonds for the vertical wires 118 may be formed on the bondpads 116 using any suitable mechanism and/or metallurgy. Gold vertical wire 118 may be used in some example embodiments. In other example embodiments, copper vertical wire 118 may be used. A wire nozzle with a heated tip may be used to position the vertical wire 118 over a bondpad 116 to fuse the wire onto the bondpad 116. Then the wire may be drawn in a fashion where the wire is relatively straight and vertical for a predetermined distance (e.g., the final height of the stacked die package 100, etc.) and then bent to make a second wirebond to another bondpad or dummy surface (e.g., a temporary and/or sacrificial coupon provided above or below the stack of dies 102, 104, 106, 108, 110 during fabrication). In cases where the second wirebond is made to another bondpad, a predetermined height above that bondpad may also have the wire disposed substantially vertically. In this case, the wire drawn for forming vertical wires over both the first and the second bondpads may be formed. Although temporarily, the two bondpads may be electrically shorted, and upon molding and grinding, a portion of the wire (e.g., at least the non-vertical portions) between the first bondpad and the second bondpad may be removed. As a result, a vertical wire 118 extending from the first bondpad 116 and a vertical wire 118 extending from the second bondpad 116 may remain after molding and grinding. In this way, all of the bondpads 116 that are to have vertical wires 118 protruding therefrom may be wirebonded with a predetermined distance of vertical wire run prior to forming molding around the dies 102, 104, 106, 108, 110 of the die stack.

As discussed above, in some example embodiments, a dummy or sacrificial coupon may be employed in forming the vertical wires 118 protruding from the bondpads 116. In these example embodiments, where a dummy coupon (e.g., a dummy or sacrificial die) is employed for forming the vertical wires 118, instead of wirebonding between two different bondpads 116, wirebonding may be between a bondpad 116 and a surface of the dummy coupon. The dummy coupon may be provided either above the die stack (e.g., over die 110) or under the die stack (e.g., under die 102), according to example embodiments. In some example embodiments, after the vertical wires 118 have been placed with wirebonds formed, and the dies 102, 104, 106, 108, 110 have been encapsulated in the molding 114, the dummy coupon may be ground away. In other example embodiments, the dummy coupon may remain with the die stack. It will be appreciated that even if the dummy coupon remains, it will not be electrically shorted to any of the bondpads 116 after fabricating the stacked die package 100. It will be appreciated that in some alternative example embodiments there may be more than one dummy coupon used for the purposes of temporary wire runs for forming the vertical wires 118. It will further be appreciated that in some further alternative example embodiments a substrate may be provided for forming the stacked dies 102, 104, 106, 108, 110 (e.g., a substrate upon which the dies may be stacked) to provide a structure on which to perform the die 102, 104, 106, 108, 110 stacking. In these alternative embodiments, the substrate may remain or may be ground away after molding.

The stacked die package 100 may have any suitable number of dies 102, 104, 106, 108, 110 disposed thereon. Although for illustrative purposes, five dies 102, 104, 106, 108, 110 are depicted in FIG. 1, it will be appreciated that there may be a greater number or a fewer number of dies in the stacked die package 100, in accordance with example embodiments of the disclosure. The dies may be any suitable electronic components including, but not limited to, integrated circuits, surface mounted devices, active devices, passive devices, diodes, transistors, connectors, resistors, inductors, capacitors, microelectromechanical systems (MEMSs), combinations thereof, or the like.

Molding compound may be disposed around the dies 102, 104, 106, 108, 110 of the stacked die package 100. The molding compound may be any suitable molding material. For example, the molding compound may be a liquid dispensed thermosetting epoxy resin molding compound. The molding compound may be deposited on the surface of the stacked die package 100 using any suitable mechanism including, but not limited to, liquid dispense, spin coating, spray coating, combinations thereof, or the like. The molding compound may be cured using a heated chase and/or in a heated environment, in accordance with example embodiments of the disclosure. The curing process may drive cross-linking and/or hardening of the molding compound to form the molding 114. In example embodiments, the molding 114 may have fillers and/or other materials therein to preferentially control the coefficient of thermal expansion (CTE), reduce stresses, impart flame retardant properties, promote adhesion, and/or reduce moisture uptake in the molding 114. The molding 114, in example embodiments, may be any suitable thickness.

The RDL 122 may have one or more packaging build-up layers, where the packaging build-up layers may have interconnects formed therein. The build-up layer that is most proximal to the surface of the molding may have contacts therein for contacting the tips or wire termination 120 of the vertical wires. In other words, the first build-up layer formed immediately over the molding may have contacts to each of the vertical wires of the stacked die package 100. Additionally, the last build-up layer that is formed may have package-to-board interconnects, such as BGA or other area or periphery array package-to-board connections, formed thereon. The build-up layers may be fabricated of any suitable material, including polymer material, ceramic material, plastics, composite materials, glass, epoxy laminates of fiberglass sheets, FR-4 materials, FR-5 materials, combinations thereof, or the like.

It will be appreciated that the build-up layers may be fabricated in any suitable fashion. For example dielectric laminate material may be laminated on the molding 114. Vias and/or trenches may be patterned in the build-up layer using any suitable mechanism, including photolithography, plasma etch, laser ablation, wet etch, combinations thereof, or the like. The vias and trenches may be defined by vertical and horizontal metal traces, respectively, within the build-up layer. The vias and trenches may then be filled with metal, such as by electroless metal plating, electrolytic metal plating, physical vapor deposition, combinations thereof, or the like. Excess metal may be removed by any suitable mechanism, such as etch, clean, polish, and/or chemical mechanical polish (CMP), combinations thereof, or the like. Subsequent build-up layers (e.g., higher levels of build-up layers) on either side of the core may be formed by the same aforementioned processes. In some example embodiments, during this processing, the partially finished stacked die package 100 may be held in a carrier or substrate, such as along with other stacked die package 100 work in progress (WIP). In these example embodiments, one or more processes for forming the stacked die package 100 may be performed in a batch fashion and/or nearly concurrently for a collection of WIP.

The bondpads 116, as provided on the dies 102, 104, 106, 108, 110, may have geometries to reduce cross-talk between the vertical wires 118, in accordance with embodiments of the disclosure. According to example embodiments, the space between the signal bondpads 116 and the ground bondpads 116 may be relatively reduced. In example embodiments, the width of the signal groundpads may be greater than half of the pitch between the signal groundpad 116 and an adjacent ground bondpad 116. In other example embodiments, the width of a signal bondpad 116 may be greater than 70% of the pitch between adjacent bondpads 116. According to example embodiments, the width of the signal bondpads 116 may have a size and shape such that the periphery of the signal bondpads 116 may be relatively more proximal to an adjacent ground bondpad 116 compared to a bondpad 116 that is sized based on only mechanical bonding considerations. In further example embodiments, the width of a signal bondpad 116 may be approximately double the width of a space between the signal bondpad 116 and an adjacent ground bondpad 116. In some other example embodiments, the width of a signal bondpad 116 may be approximately double of the width of an adjacent ground bondpad 116. In yet other example embodiments, the width of the signal bondpad 116 may be approximately double the minimum width for the signal bondpad 116 for making a reliable mechanical wirebond thereto.

Figure 2:
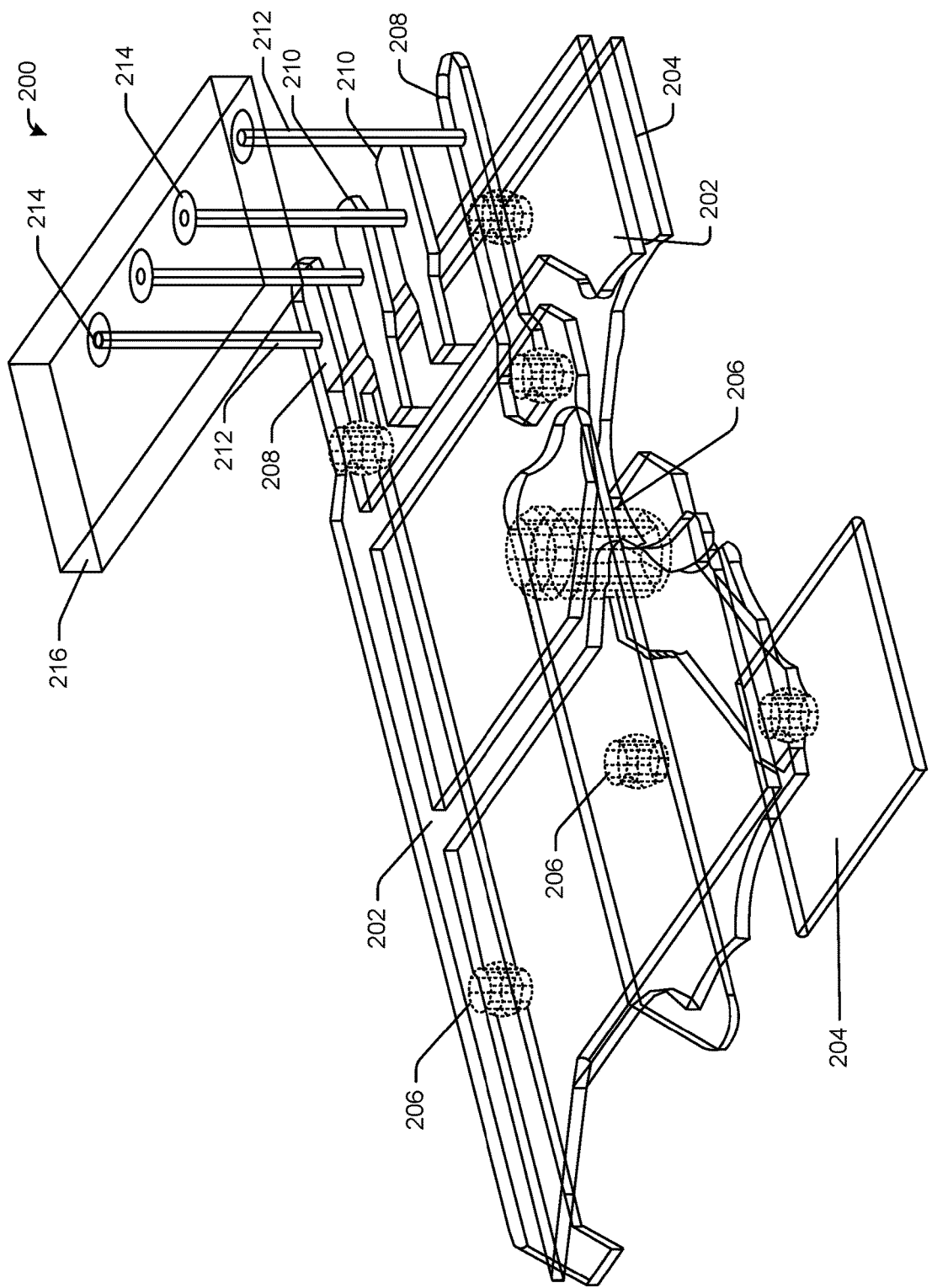
FIG. 2 depicts a simplified perspective view schematic diagram illustrating interconnections of a portion of a die with vertical wires connected to bondpads within a stacked die package, in accordance with example embodiments of the disclosure.

FIG. 2 depicts a simplified perspective view schematic diagram illustrating interconnections of a portion 200 of a die with vertical wires 212 connected to bondpads 208, 210 within a stacked die package, in accordance with example embodiments of the disclosure. The portion 200 of the die may have a first level of metal interconnects 202 and a second level of metal interconnects 204. The first level of metal interconnects 202 and second level of metal interconnects 204 on the portion 200 of die may have connections therebetween or to other levels of metal traces as vias 206. The bondpads 208, 210 may be formed as part of the metal interconnect levels 202, 204. In example embodiments, the bondpads 208, 210 may be part of a ground-signal-signal-ground quartet. In example embodiments, the bondpads 208 may be ground bondpads, and the bondpads 210 may be signal bondpads. In example embodiments, the vertical wires 212 may be wirebonded to the bondpads 208, 210 and terminate at wire tips 214. The wire tips 214 may be contacted by pads and/or traces in an RDL 216.

The bondpads 208, 210 of the portion 200 of the die may be sized to reduce cross-talk between adjacent vertical wires 212, in accordance with example embodiments of the disclosure. The bondpads 210 may be sized in a manner such that the distance between the bondpads 210 to its most proximal ground bondpad 208 may be less than the width of the signal bondpad 210.

Figure 3A:
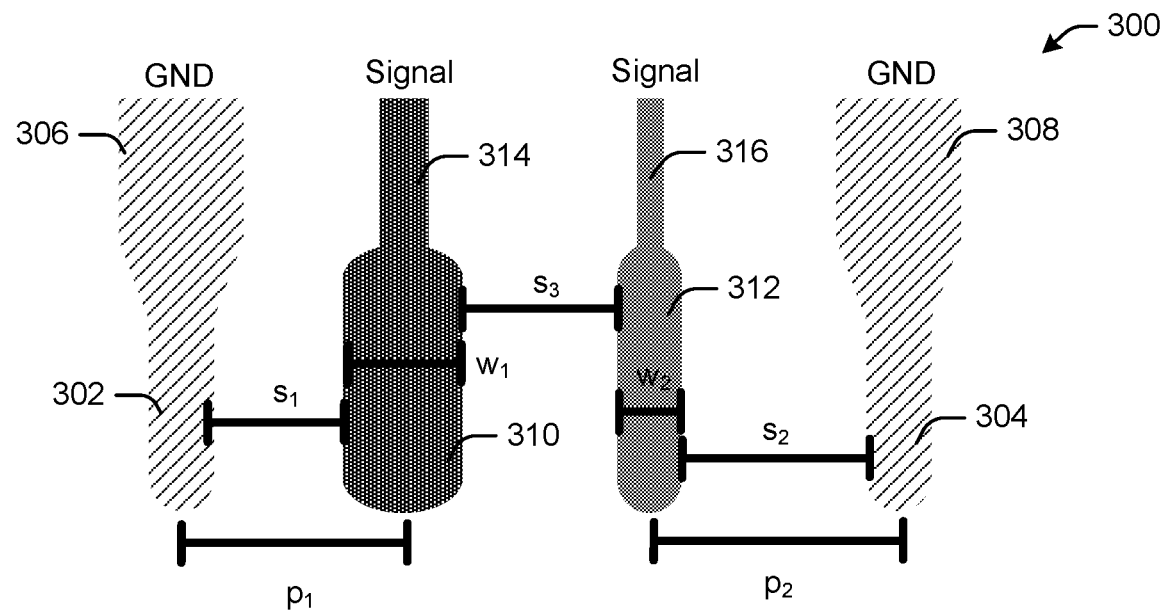
FIGS. 3A and 3B depict simplified top down schematic diagrams illustrating bondpads for vertical interconnects, in accordance with example embodiments of the disclosure.
Figure 3B:
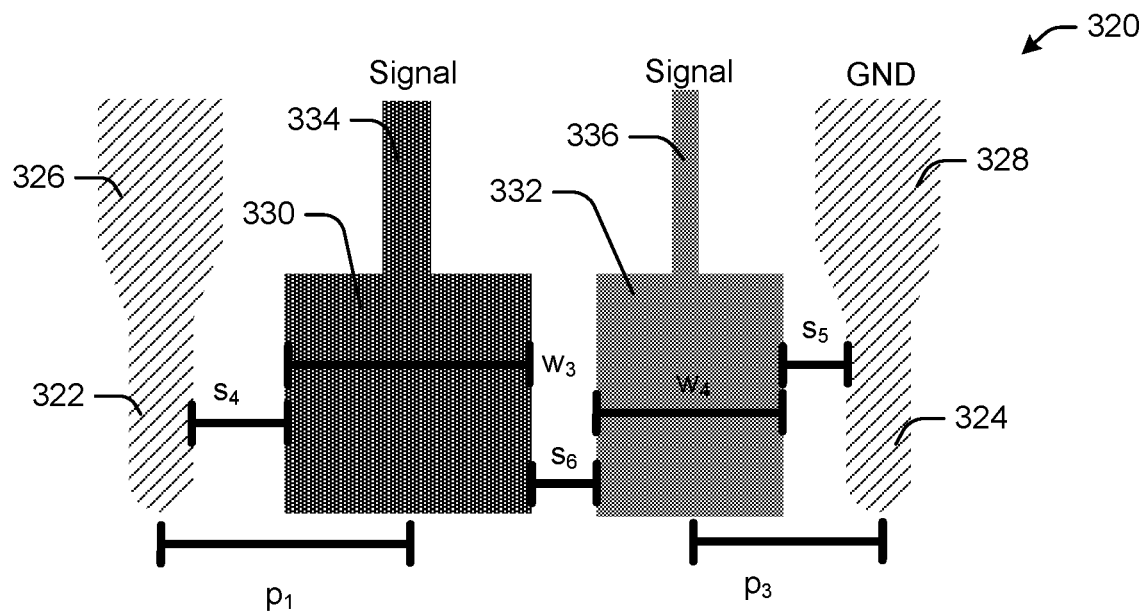

FIGS. 3A and 3B depict simplified top down schematic diagrams 300, 320 illustrating bondpads 302, 304, 310, 312, 322, 324, 330, 332 for vertical interconnects, in accordance with example embodiments of the disclosure. The bondpad configuration of FIG. 3B may exhibit reduced levels of signal cross-talk between vertical wires attached to the bondpads 302, 304, 310, 312, 322, 324, 330, 332. FIG. 3A may represent bondpads 302, 304, 310, 312 that may be sized to accommodate a reliable wirebond thereon. On the other hand, FIG. 3B may show bondpads 322, 324, 330, 332 that may result in reduced levels of signal cross-talk, in accordance with example embodiments of the disclosure.

In FIG. 3A, bondpads 310, 312 may each be connected to electrical traces 314, 316, respectively, and may be I/O contacts for signals that are to be received and/or sent via bondpads 310, 312. The signal bondpads 310, 312 may have a width of $w_1$ and $w_2$, respectively, and may be separated from each other by a space of $s_3$. Bondpad 310 may be separated from ground bondpad 302, as attached to a ground line 306, by a spacing of $s_1$. The pitch between bondpad 302 and bondpad 310 may be $p_1$. Similarly, bondpad 312 may be separated from ground bondpad 304, as attached to a ground line 308, by a spacing of $s_2$. The pitch between bondpad 304 and bondpad 312 may be $p_2$. In this case, $w_1$ is approximately the same as $s_1$ and approximately half of $p_1$. Additionally, $w_2$ may be less than $s_2$ and less than half of $p_2$. In example embodiments, if $p_1$ and $p_2$ were equal, then the cross-talk between bondpad 310 and bondpad 302 may be less than the cross-talk between the bondpads 312 and 304. Indeed, the closer the signal bondpads 310, 312 are to adjacent bondpads 302, 304, the lower the cross-talk may be between adjacent vertical wires protruding from the bondpads 302, 304, 310, 312.

In FIG. 3B, bondpads 330, 332 may each be connected to electrical traces 334, 336, respectively, and may be I/O contacts for signals that are to be received and/or sent via bondpads 330, 332. The signal bondpads 330, 332 may have a width of $w_3$ and $w_4$, respectively, and may be separated from each other by a space of $s_6$. Bondpad 330 may be separated from ground bondpad 322, as attached to a ground line 326, by a spacing of $s_4$. The pitch between bondpad 322 and bondpad 330 may be $p_1$ (e.g., the same as the pitch between bondpad 302 and bondpad 310 in FIG. 3A). Similarly, bondpad 332 may be separated from ground bondpad 324, as attached to a ground line 328, by a spacing of $s_5$. The pitch between bondpad 324 and bondpad 332 may be $p_3$. In this case, $w_3$ is greater than $s_4$ and greater than approximately half of $p_1$, in accordance with example embodiments of the disclosure. Additionally, $w_4$ may be greater than $s_5$ and greater than half of $p_3$.

In comparing the layout of diagram 300 of FIG. 3A to the layout of diagram 320 of FIG. 3B, the cross-talk resulting from the wire that may be connected to the bondpad 322, 330 configuration may be less than the cross-talk resulting from the bondpad 302, 310 configuration, even though the pitch of those two different configurations may be the same. Additionally, in some example embodiments, the sharper corners of the bondpad 330 may also increase the length of periphery of the bondpad 330 in relative proximity to ground bondpad 322, resulting in less cross-talk. Indeed, the closer the signal bondpads 310, 312 are to adjacent bondpads 302, 304, the lower the cross-talk may be between adjacent vertical wires protruding from the bondpads 302, 304, 310, 312. According to example embodiments, the bondpads 330, 332 may have a width that is greater than 50% of the pitch to adjacent bondpads 322, 324. According to further example embodiments, the bondpads 330, 332 may have a width that is greater than 70% of the pitch to adjacent bondpads 322, 324. According to still further example embodiments, the bondpads 330, 332 may have a shape that provides a relatively great distance of periphery in relative proximity to adjacent bondpads 322, 324. In these example embodiments, the bondpads 330, 332 may be rectangular shaped. According to example embodiments of the disclosure, the bondpads 330, 332 may be 50% greater than a size that may be needed to form reliable wirebonds thereto.

In some example embodiments, $p_1$ may be approximately 130 µm, and $w_3$ may be approximately 92 µm. In this case, the pad width may be approximately 70.8% of the pitch. In some example embodiments, $p_1$ may be approximately in the range of about 70 µm to about 200 µm, and $w_3$ may be approximately in the range of about greater than 50% to about 90% of $p_1$. In some cases, the width of a bondpad 330, 332 needed for forming reliable wirebonds may be approximately 65 µm. In these cases, in accordance with example embodiments of the disclosure, the bondpads 330, 332 may be upsized from a minimum requirement of 65 µm by approximately 50% to about 100 µm. In other example embodiments, the bondpads 330, 332 may be upsized by approximately a range of about 10% to about 70%. Further still, the minimum required bondpad size may be a size between about 20 µm and about 200 µm.

Figure 4:
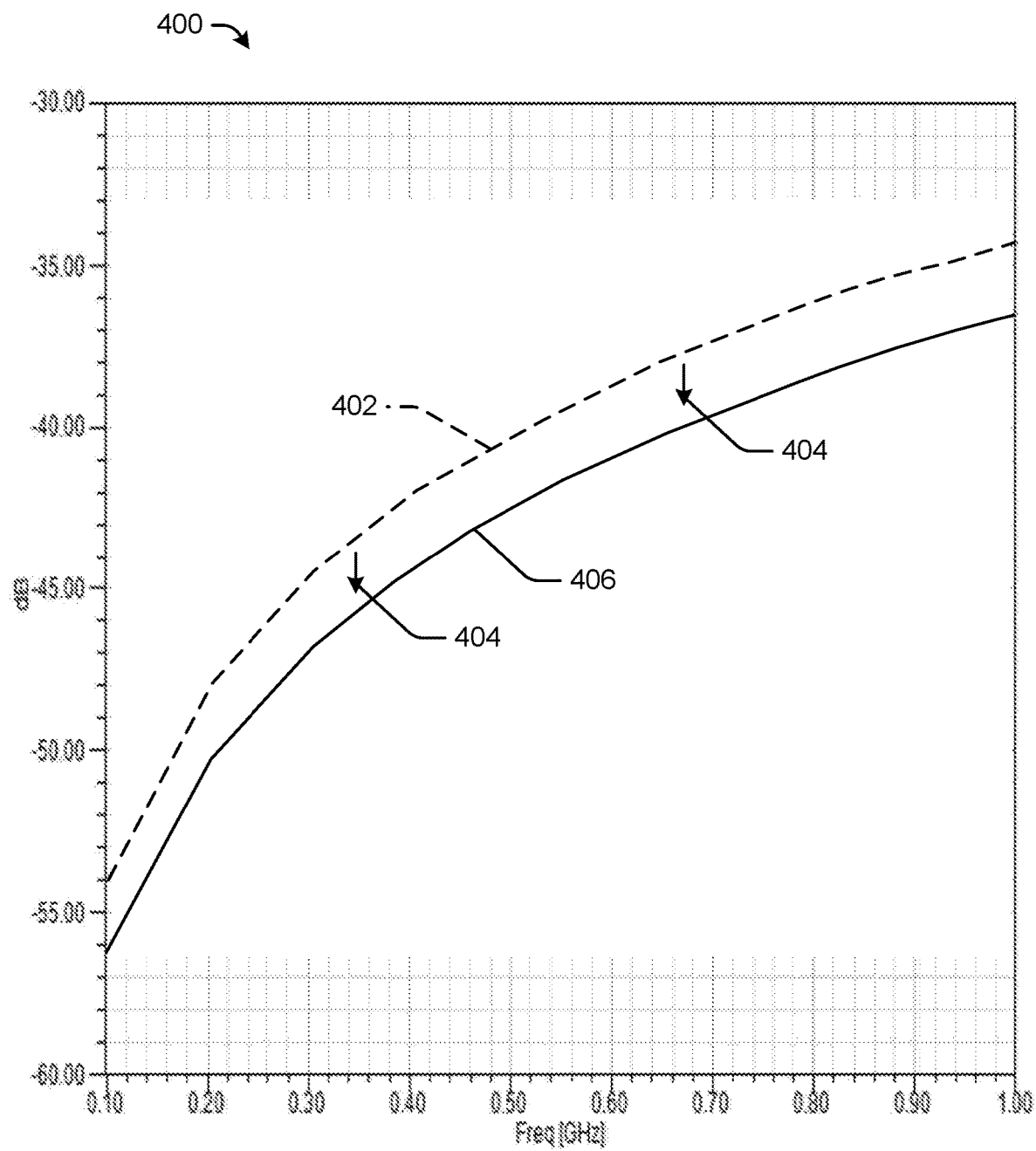
FIG. 4 depicts a chart illustrating simulation results of cross-talk and improvements thereto by implementing low cross-talk bondpads with vertical wirebonds, in accordance with example embodiments of the disclosure.

FIG. 4 depicts a chart illustrating simulation results 400 of cross-talk 402, 406 and improvements 404 thereto by implementing low cross-talk bondpads with vertical wirebonds, in accordance with example embodiments of the disclosure. The cross-talk value, as depicted on the y-axis, is the ratio of the power in a victim wire to the power in an aggressor wire. In this non-limiting example, the approximately 2 dB improvement (e.g., reduction) 404 is a result of upsizing a bondpad of the aggressor line from 65 µm to 92 µm in width, while holding the pitch between the aggressor bondpad and the victim bondpad at a fixed 130 µm, across the range of frequencies on the x-axis.

Figure 5A:
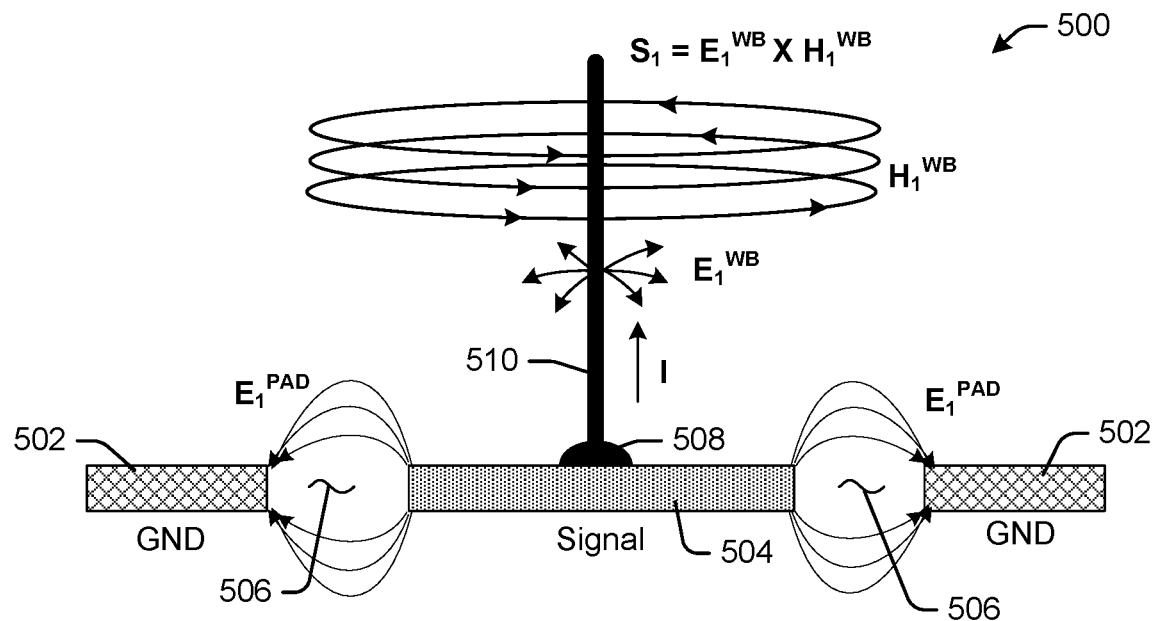
FIGS. 5A and 5B depict a simplified cross-sectional schematic diagram illustrating electric fields, magnetic fields, and Poynting vectors resulting from signal bondpads of different geometries and signal vertical wires, in accordance with example embodiments of the disclosure.
Figure 5B:
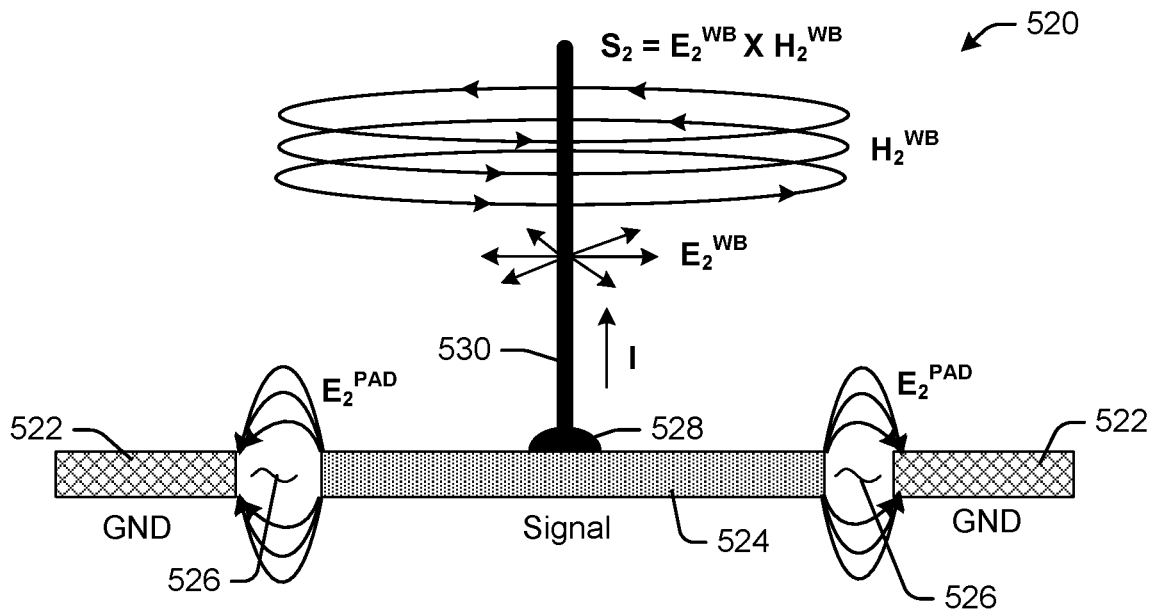

FIGS. 5A and 5B depict a simplified cross-sectional schematic diagram illustrating electric fields, magnetic fields, and Poynting vectors resulting from signal bondpads 504, 524 of different geometries and signal vertical wires 510, 530, in accordance with example embodiments of the disclosure. In the environment 500 of FIG. 5A, the signal bondpad 504 may have a wirebond 508 with a vertical wire 510 protruding in a normal direction therefrom. The space 506 between the signal bondpad 504 and the ground bondpads 502 may give rise to electric field ($\overrightarrow{E_1^{pad}}$) therebetween. The current ($\vec{I}$) may induce a magnetic field ($\overrightarrow{H_1^{WB}}$) around the vertical wire 510 and an electric field ($\overrightarrow{E_1^{WB}}$) in substantially a radial direction outward from the vertical wire 510. However, due to charge mirroring on the ground bondpads 502, $\overrightarrow{E_1^{WB}}$ may be slightly vectored towards the ground bondpads 502. In the environment 520 of FIG. 5B, the signal bondpad 524 may have a wirebond 528 with a vertical wire 530 protruding in a normal direction therefrom. The space 526 between the signal bondpad 524 and the ground bondpads 522, which may be smaller than the space 506 of the environment 500 of FIG. 5A, may give rise to electric field ($\overrightarrow{E_2^{pad}}$) therebetween. In example embodiments, $\overrightarrow{E_2^{pad}}$ may be greater than $\overrightarrow{E_1^{pad}}$, since the space 526 is smaller than the space 506. The current ($\vec{I}$) (e.g., the same as in the environment 500) may induce a magnetic field ($\overrightarrow{H_2^{WB}}$) around the vertical wire 530 and an electric field ($\overrightarrow{E_2^{WB}}$) in substantially a radial direction outward from the vertical wire 530. Although $\overrightarrow{E_2^{WB}}$ may again be slightly vectored towards the ground bondpads 522, $\overrightarrow{E_2^{WB}}$ may be more orthonormal to the vertical wire 530 than in the case of $\overrightarrow{E_1^{WB}}$ and the vertical wire 510. This may be due to the pad geometry of the environment 520 relative to the pad geometry of the environment 500.

As a result of $\overrightarrow{E_2^{WB}}$ being more perpendicular to the vertical wire 530, the Poynting vector ($\vec{S_1}=\overrightarrow{E_1^{WB}}\times\overrightarrow{H_1^{WB}}$) may be less aligned with the current ($\vec{I}$) flowing in the vertical wire 510 than ($\vec{S_2}=\overrightarrow{E_2^{WB}}\times\overrightarrow{H_2^{WB}}$) is aligned with the current ($\vec{I}$) flowing in the vertical wire 530. As a result, the power transfer in vertical wire 530 may be relatively more along the vertical wire 530, rather than victimizing adjacent wires, when compared to the vertical wire 510. As a result, the wider signal bondpad 524 of the environment 520 may result in relatively less cross-talk relative to the narrower signal bondpad 504 of the environment 500.

Figure 6:
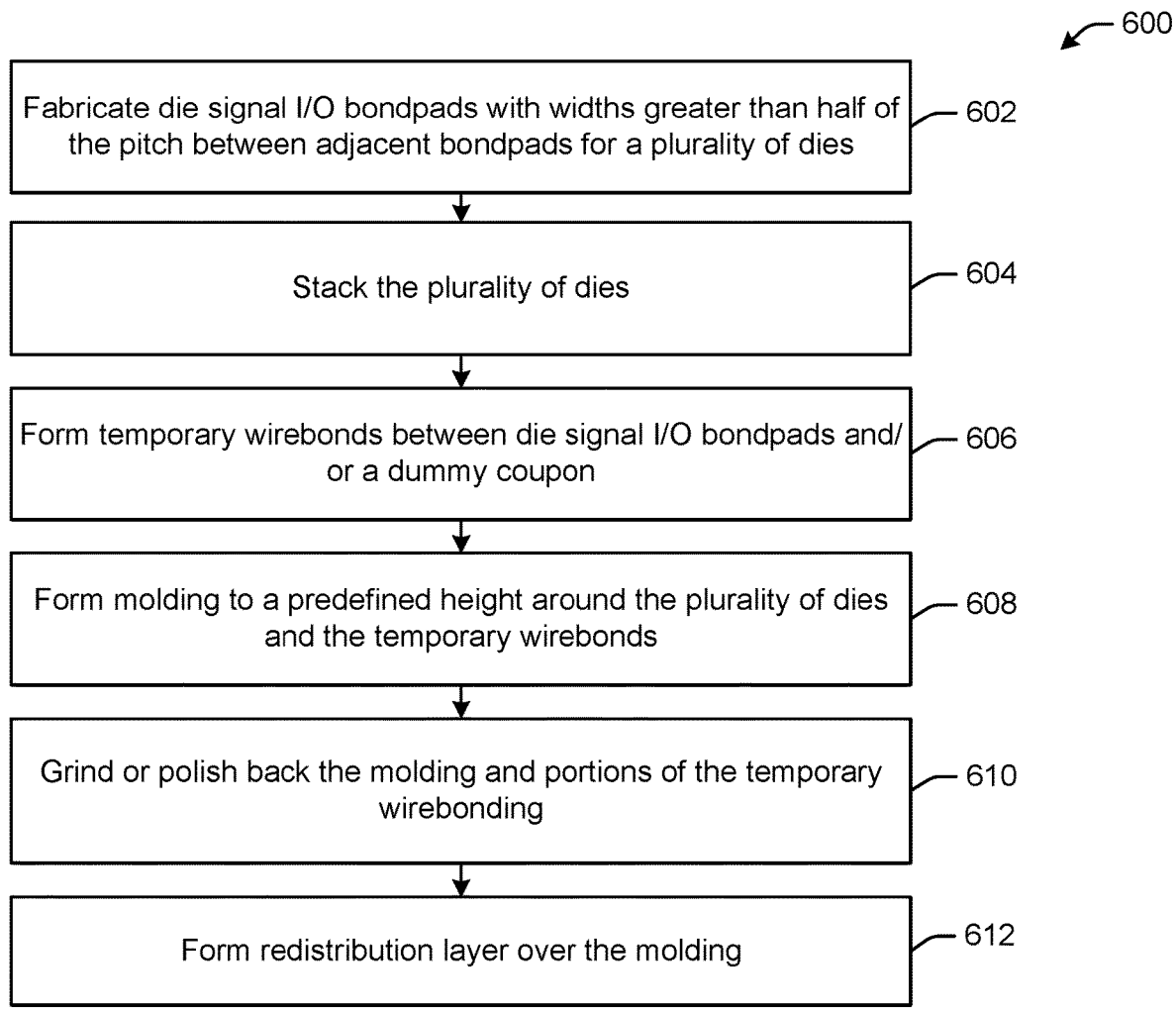
FIG. 6 depicts a flow diagram illustrating an example method for fabricating the stacked die package with vertical wirebonds connected to the low cross-talk bondpads of FIGS. 1, 2, 3B and 5B, in accordance with example embodiments of the disclosure.

FIG. 6 depicts a flow diagram illustrating an example method for fabricating the stacked die package with vertical wirebonds connected to the low cross-talk bondpads of FIGS. 1, 2, 3B and 5B, in accordance with example embodiments of the disclosure.

At block 602, a plurality of dies may be fabricated, where I/O bondpads on the dies have widths greater than half the pitch between adjacent bondpads. The dies may be any suitable electronic component, such as a semiconductor-based electronic device. In example embodiments, the die may be an integrated circuit (IC) with at least one active device (e.g., transistors, diodes, etc.) and/or passive device (e.g., resistors, inductors, capacitors, etc.).

At block 604, the plurality of dies may be stacked. As discussed above, in some example embodiments, the plurality of dies may be stacked with adhesives provided therebetween to hold the dies together. In yet other example embodiments, the dies may be stacked on a substrate to provide structure to the stacking. In some cases, a dummy coupon may be stacked on top or underneath the stacked dies.

At block 606, temporary wirebonds between die signal I/O bondpads and/or a dummy coupon may be formed. As discussed above, in some cases, wirebonds with a relatively vertical wire run may be formed over the bondpads, as fabricated by the processes of block 602. In some cases, wires may be wirebonded between two different bondpads of the stack of dies, with each end having a relatively vertical run of the wire over each of the bondpads. Alternatively, when a dummy coupon is used, one end of a wire may be wirebonded to a bondpad with a relatively vertical wire run over the bondpad and the other end of the wire wirebonded to the dummy coupon.

At block 608, molding may be formed to a predetermined height around the plurality of dies and temporary wirebonds. The molding may be formed by providing molding compound around the stack of dies and then curing the molding compound. The molding may be disposed in a manner (e.g., flow rate, direction, etc.) to minimize and/or prevent wire sweep and/or other defects that may arise from encapsulating the stack of dies.

At block 610, the molding, along with portions of the temporary wirebonding, may be ground or polished back. During the grinding and/or polishing process, in example embodiments, horizontal runs of the wires may be ground/removed. Thus, after the grinding and/or polishing process, only vertical wires may remain. These vertical wires may be substantially normal to the respective bondpad to which the vertical wire is connected. In the cases where a dummy coupon is used in the temporary wirebonding process, the dummy coupon may remain after the grinding process or, alternatively, the dummy coupon may be removed, such as by grinding it away while grinding the molding compound.

At block 612, a redistribution layer (RDL) may be formed over the molding. The RDL may include one or more build-up layers with electrical traces provided in dielectric materials. The build-up layer that is most proximal to the surface of the molding may have contacts therein for contacting the tips of the vertical wires, as formed after the grinding process of block 610. In other words, the first build-up layer formed immediately over the molding may have contacts to each of the vertical wires of the stacked die package. Additionally, the last build-up layer that is formed may have package-to-board interconnects, such as BGA or other area or periphery array package-to-board connections, formed thereon.

It should be noted that the method 600 may be modified in various ways in accordance with certain embodiments of the disclosure. For example, one or more operations of the method 600 may be eliminated or executed out of order in other embodiments of the disclosure. Additionally, other operations may be added to the method 600 in accordance with other embodiments of the disclosure.

It will be appreciated that the apparatus described herein may be any suitable type of microelectronics packaging and configurations thereof, including, for example, system in a package (SiP), system on a package (SOP), package on package (PoP), interposer package, 3D stacked package, etc. In fact, any suitable type of microelectronic components may be provided in the stacked die package with low cross-talk bondpads, as described herein. For example, microcontrollers, microprocessors, baseband processors, digital signal processors, memory dies, field gate arrays, memory dies, logic gate dies, passive component dies, MEMSs, surface mounted devices, application specific integrated circuits, baseband processors, amplifiers, filters, combinations thereof, or the like may be packaged in the stacked die package with low cross-talk bondpads, as disclosed herein. The stacked die package with low cross-talk bondpads, as disclosed herein, may be provided in any variety of electronic devices including, consumer, industrial, military, communications, infrastructural, and/or other electronic devices.

The stacked die package with low cross-talk bondpads, as described herein, may be used to house one or more processors. The one or more processors may include, without limitation, a central processing unit (CPU), a digital signal processor(s) (DSP), a reduced instruction set computer (RISC), a complex instruction set computer (CISC), a microprocessor, a microcontroller, a field programmable gate array (FPGA), or any combination thereof. The processors may also include one or more application specific integrated circuits (ASICs) or application specific standard products (ASSPs) for handling specific data processing functions or tasks. In certain embodiments, the processors may be based on an Intel® Architecture system, and the one or more processors and any chipsets included in an electronic device may be from a family of Intel® processors and chipsets, such as the Intel® Atom® processor(s) family or Intel-64 processors (e.g., Sandy Bridge®, Ivy Bridge®, Haswell®, Broadwell®, Skylake®, etc.).

Additionally or alternatively, the stacked die package with low cross-talk bondpads, as described herein, may be used to house one or more memory chips. The memory may include one or more volatile and/or non-volatile memory devices including, but not limited to, magnetic storage devices, read-only memory (ROM), random access memory (RAM), dynamic RAM (DRAM), static RAM (SRAM), synchronous dynamic RAM (SDRAM), double data rate (DDR) SDRAM (DDR-SDRAM), RAM-BUS DRAM (RDRAM), flash memory devices, electrically erasable programmable read-only memory (EEPROM), non-volatile RAM (NVRAM), universal serial bus (USB) removable memory, or combinations thereof.

In example embodiments, the electronic device in which the stacked die package with low cross-talk connection pads is provided may be a computing device. Such a computing device may house one or more boards on which the stacked die package with low cross-talk bondpads may be disposed. The board may include a number of components, including but not limited to a processor and/or at least one communication chip. The processor may be physically and electrically connected to a board through, for example, electrical connections of the stacked die package with low cross-talk bondpads. The computing device may further include a plurality of communication chips. For instance, a first communication chip may be dedicated to shorter range wireless communications such as Wi-Fi and Bluetooth, and a second communication chip may be dedicated to longer range wireless communications such as GPS, EDGE, GPRS, CDMA, WiMAX, LTE, EV-DO, and others. In various example embodiments, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, a digital video recorder, combinations thereof, or the like. In further example embodiments, the computing device may be any other electronic device that processes data.

Certain dimensions of the bondpads and features thereof are described herein using the terms "approximately," "about," and/or "substantially." As used herein, these terms indicate that each of the described dimensions is not a strict boundary or parameter and does not exclude functionally similar variations therefrom. Unless context or the description indicates otherwise, the use of the aforementioned terms in connection with a numerical parameter indicates that the numerical parameter includes variations that, using mathematical and industrial principles accepted in the art (e.g., rounding, measurement or other systematic errors, manufacturing tolerances, etc.), would not vary the least significant digit.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

While the disclosure includes various embodiments, including at least a best mode, it is to be understood that many alternatives, modifications, and variations will be apparent to those skilled in the art in light of the foregoing description. Accordingly, the disclosure is intended to embrace all such alternatives, modifications, and variations, which fall within the scope of the included claims. All matters disclosed herein or shown in the accompanying drawings are to be interpreted in an illustrative and non-limiting sense.

This written description uses examples to disclose certain embodiments of the disclosure, including the best mode, and also to enable any person skilled in the art to practice certain embodiments of the disclosure, including making and using any apparatus, devices, or systems and performing any incorporated methods and processes. The patentable scope of certain embodiments of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

According to example embodiments of the disclosure, there may be a semiconductor package, comprising: a first die stacked upon a second die, the first die having a first bondpad and a second bondpad, wherein a width of the first bondpad is greater than a space between the first bondpad and the second bondpad; a first vertical wire electrically connected to, and substantially normal to the first bondpad; a second vertical wire, electrically connected to, and substantially normal to the second bondpad; a molding surrounding the first die and the second die; and a redistribution layer disposed over the molding and electrically coupled to the first vertical wire and the second vertical wire. In some example embodiments, first bondpad and the second bondpad define a pitch between the first bondpad and the second bondpad, and wherein the width of the first bondpad is greater than half of the pitch. In further example embodiments, the width of the first bondpad is greater than about 70% of the pitch. In still further example embodiments, the pitch is in the range of about 60 microns to about 200 microns. In yet further aspects, the space is in the range of about 10 microns and about 100 microns. In still further aspects of the disclosure, a first tip of the first vertical wire protrudes from a surface of the molding, and a second tip of the second vertical wire protrudes from the surface of the molding. In some further embodiments, the redistribution layer comprises a first contact electrically connected to the first tip and a second contact electrically connected to the second tip.

According to further example embodiments of the disclosure, the first bondpad is a signal bondpad and the second bondpad is a ground bondpad. In example embodiments, the second die comprises a third bondpad and fourth bondpad, wherein the first die is stacked upon the second die without overlying the third bondpad or the fourth bondpad. In further example embodiments, the third bondpad has a width that is greater than a space between the third bondpad and the second bondpad, and wherein the semiconductor package further comprises a third vertical wire protruding from the third bondpad in a substantially normal direction to the third bondpad and a fourth vertical wire protruding from the fourth bondpad in a substantially normal direction to the fourth bondpad. In additional example embodiments, the first bondpad is electrically connected to the third bondpad via the first vertical wire, the third vertical wire, and the redistribution layer. In still further example embodiments, the semiconductor package includes a third die overlying, at least in part, the first die without overlying the first bondpad or the second bondpad. In yet further example embodiments, the semiconductor package includes an adhesive disposed between the first die and the second die. In certain aspects, the redistribution layer comprises a first build-up layer having traces connected to the first vertical wire and the second vertical wire. Further still, in some cases, the redistribution layer comprises a second build-up layer overlying the first build-up layer and electrically coupled to one or more package-to-board interconnects.

According to example embodiments of the disclosure, there may be a method, comprising: stacking a first die over a second die, the first die having a first bondpad and a second bondpad, wherein a width of the first bond pad is greater than a space between the first bondpad and the second bondpad; forming a first wirebond on the first bondpad; providing a first vertical wire substantially normal to the first bondpad for a first predetermined height, the first vertical wire connected to the first wirebond; forming a second wirebond on the second bondpad; providing a second vertical wire substantially normal to the second bondpad for a second predetermined height, the second vertical wire connected to the second wirebond; forming a molding surrounding the first die and the second die; and grinding the molding to expose a first tip of the first vertical wire and a second tip of the second vertical wire. In some example embodiments, stacking the first die over the second die further comprises providing an adhesive between the first die and the second die. In still further example embodiments, forming the first wirebond comprises melting an end of the first vertical wire to the first bondpad. In yet further example embodiments, forming the first vertical wire substantially normal to the first bondpad for the first predetermined height comprises pulling the first vertical wire in a direction normal to the first bondpad. In additional embodiments, providing the first vertical wire substantially normal to the first bondpad for the first predetermined height comprises attaching the first vertical wire to a dummy coupon with a third wirebond. In still further example embodiments, the method further includes forming a redistribution layer overlying the molding and electrically coupled to the first vertical wire and the second vertical wire. Further still, in example embodiments, the width of the first bond pad is 50% greater than the space between the first bondpad and the second bondpad. In yet further example embodiments, the first bondpad and second bondpad define a pitch between the first bondpad and the second bondpad, and wherein the width of the first bondpad is greater than half of the pitch. In additional embodiments, the width of the first bondpad is greater than about 70% of the pitch. In yet other embodiments, the pitch is in the range of about 60 microns to about 200 microns.

What is claimed:

1. A semiconductor package, comprising:
   a first die disposed over a second die, the first die having a first bondpad and a second bondpad, wherein a width of the first bondpad is greater than a space between the first bondpad and the second bondpad, and wherein the first bondpad and second bondpad define a pitch between the first bondpad and the second bondpad, and wherein the width of the first bondpad is greater than half of the pitch;
   a first vertical wire electrically connected to, and substantially normal to the first bondpad;
   a second vertical wire, electrically connected to, and substantially normal to the second bondpad;
   a molding surrounding the first die and the second die; and
   a redistribution layer disposed over the molding and electrically coupled to the first vertical wire and the second vertical wire.

2. The semiconductor package of claim 1, wherein the width of the first bondpad is greater than about 70% of the pitch.

3. The semiconductor package of claim 1, wherein the pitch is in the range of about 60 microns to about 200 microns.

4. The semiconductor package of claim 1, wherein the space is in the range of about 10 microns and about 100 microns.

5. The semiconductor package of claim 1, wherein a first tip of the first vertical wire protrudes from a surface of the molding, and wherein a second tip of the second vertical wire protrudes from a surface of the molding.

6. The semiconductor package of claim 5, wherein the redistribution layer comprises a first contact electrically connected to the first tip and a second contact electrically connected to the second tip.

7. The semiconductor package of claim 1, wherein the first bondpad is a signal bondpad and the second bondpad is a ground bondpad.

8. The semiconductor package of claim 1, wherein the second die comprises a third bondpad and a fourth bondpad, wherein the first die is disposed over the second die without overlying the third bondpad or the fourth bondpad.

9. The semiconductor package of claim 8, wherein the third bondpad has a width that is greater than a space between the third bondpad and the second bondpad, and wherein the semiconductor package further comprises a third vertical wire protruding from the third bondpad in a substantially normal direction to the third bondpad and a fourth vertical wire protruding from the fourth bondpad in a substantially normal direction to the fourth bondpad.

10. The semiconductor package of claim 9, wherein the first bondpad is electrically connected to the third bondpad via the first vertical wire, the third vertical wire, and the redistribution layer.

11. The semiconductor package of claim 1, further comprising a third die overlying, at least in part, the first die without overlying the first bondpad or the second bondpad.

12. The semiconductor package of claim 1, further comprising an adhesive disposed between the first die and the second die.

13. The semiconductor package of claim 1, wherein the redistribution layer comprises a first build-up layer having traces connected to the first vertical wire and the second vertical wire.

14. The semiconductor package of claim 13, wherein the redistribution layer comprises a second build-up layer overlying the first build-up layer and electrically coupled to one or more package-to-board interconnects.

15. A method, comprising:
stacking a first die over a second die, the first die having a first bondpad and a second bondpad, wherein a width of the first bond pad is greater than a space between the first bondpad and the second bondpad, and wherein the first bondpad and second bondpad define a pitch between the first bondpad and the second bondpad, and wherein the width of the first bondpad is greater than half of the pitch;
forming a first wirebond on the first bondpad;
providing a first vertical wire substantially normal to the first bondpad for a first predetermined height, the first vertical wire connected to the first wirebond;
forming a second wirebond on the second bondpad;
providing a second vertical wire substantially normal to the second bondpad for a second predetermined height, the second vertical wire connected to the second wirebond;
forming a molding surrounding the first die and the second die; and
grinding the molding to expose a first tip of the first vertical wire and a second tip of the second vertical wire.

16. The method of claim 15, wherein forming the first wirebond comprises melting an end of the first vertical wire to the first bondpad.

17. The method of claim 15, wherein providing the first vertical wire substantially normal to the first bondpad for the first predetermined height comprises pulling the first vertical wire in a direction normal to the first bondpad.

18. The method of claim 17, wherein providing the first vertical wire substantially normal to the first bondpad for the first predetermined height comprises attaching the first vertical wire to a dummy coupon with a third wirebond.

19. The method of claim 15, further comprising forming a redistribution layer overlying the molding and electrically coupled to the first vertical wire and the second vertical wire.

* * * * *